United States Patent [19]

Zuleeg et al.

[11] Patent Number: 4,994,892

[45] Date of Patent: Feb. 19, 1991

[54] ALUMINUM GERMANIUM OHMIC CONTACTS TO GALLIUM ARSENIDE

[75] Inventors: Rainer Zuleeg, San Juan Capistrano; Stanley H. Watanabe, Gardena; John M. Stephens, Huntington Beach, all of Calif.

[73] Assignee: McDonnell Douglas Corporation, Long Beach, Calif.

[21] Appl. No.: 916,835

[22] Filed: Oct. 9, 1986

[51] Int. Cl.⁵ ............... H01L 23/54; H01L 23/50
[52] U.S. Cl. .................................. 357/67; 357/22
[58] Field of Search ............. 357/67, 17, 19, 22

[56] References Cited

U.S. PATENT DOCUMENTS 3,935,586  1/1976  Landheer et al. ............. 357/22
4,188,710  2/1980  Davey et al. ................. 357/67

OTHER PUBLICATIONS

"Laser Annealed Ta/Ge and Ni/Ge Ohmic Contacts to GaAs"-Anderson et al., IEEE Electron Device Letters, vol. EDL-2, No. 5, 5/1981, pp. 115-117.

Primary Examiner—Rolf Hille
Assistant Examiner—S. V. Clark
Attorney, Agent, or Firm—Gregory A. Cone; John P. Scholl

[57] ABSTRACT

Ohmic contacts are attached to n-type Gallium Arsenide with an alloy of Aluminum-Germanium. The contact is prepared by depositing by evaporation a sequence of 400 Angstroms of Germanium, 300 Angstroms of Nickel, and 2000 Angstroms of Aluminum and subsequent alloying.

5 Claims, 1 Drawing Sheet

FIG.1
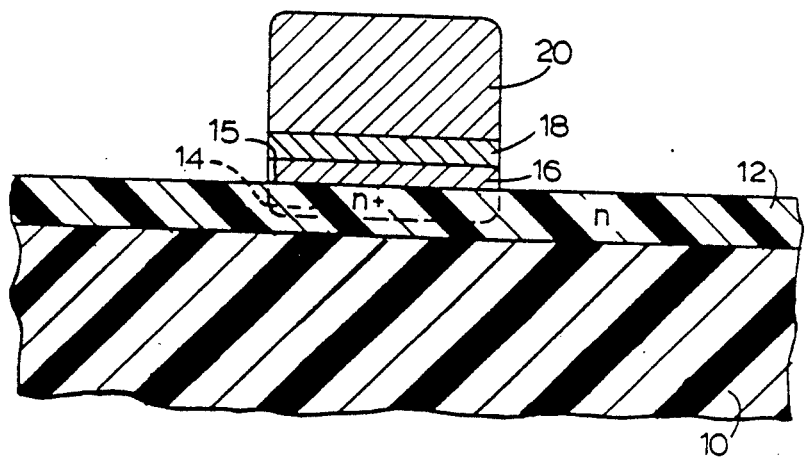
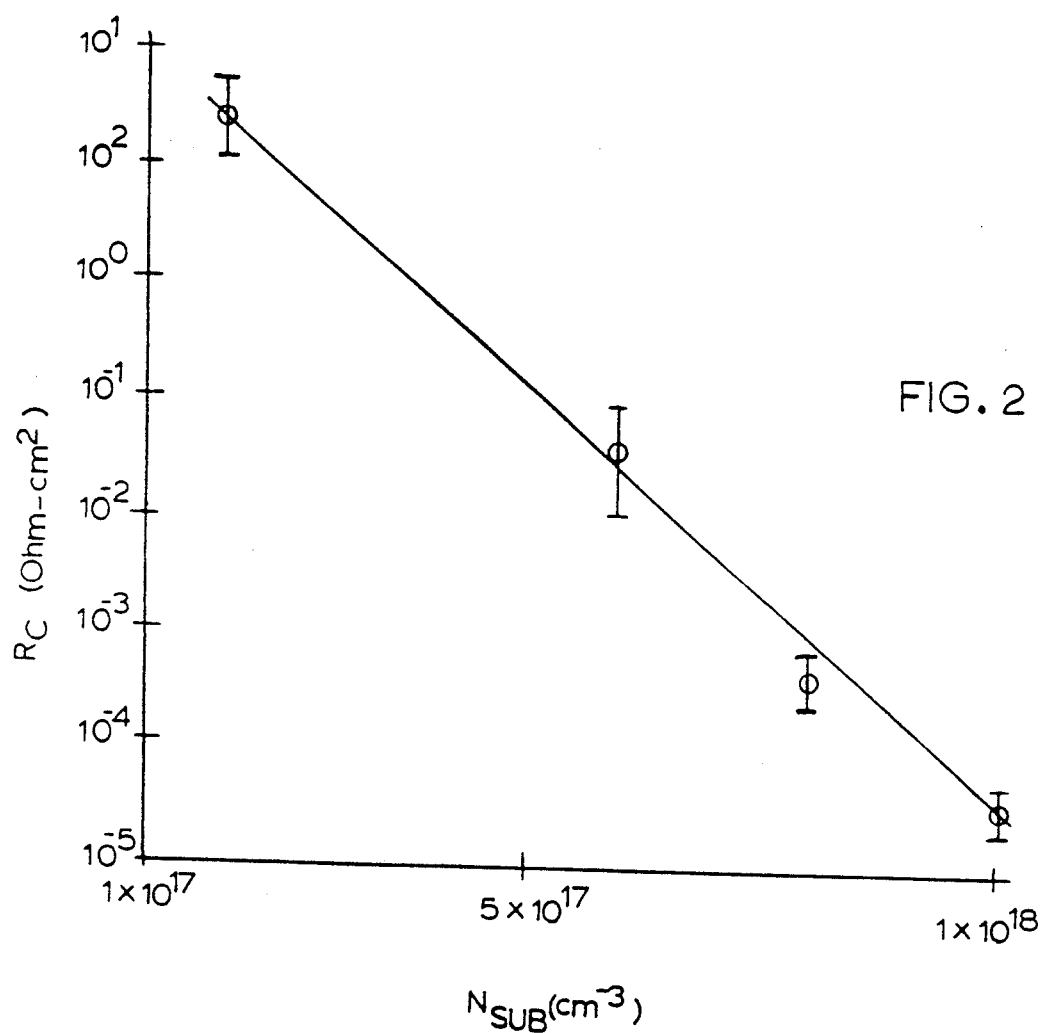
FIG. 2

ALUMINUM GERMANIUM OHMIC CONTACTS TO GALLIUM ARSENIDE

BACKGROUND OF THE INVENTION

This invention relates to the fabrication of ohmic contacts to n-type Gallium Arsenide. More particularly, this invention relates to such ohmic contacts which are fabricated from an alloy of Aluminum and Germanium.

Contact resistance to n-type Gallium Arsenide is an important process and design parameter for the advancing Gallium Arsenide integrated circuit technology. The Ni-capped, Gold Germanium (12%) eutectic ohmic contact alloy was first introduced by Braslau (N. Braslau, J.B. Gunn and J. L. Staples, "Metal-Semiconductor Contacts for GaAs Bulk Effect Devices." Solid State Electronics, Vol. 10, page 381, 1967) and is now extensively used for Au-Ge-Ni contacts with a variety of techniques and compositions. The eutectic temperature is listed as 356° C. (M. Hansen, *Constitution of Binary Alloys*, page 97, McGraw Hill Book Company, Inc., New York, 1958) and alloy temperatures up to 450° C. are used to form the ohmic contacts. To complete the ohmic contacts and form the first level of metal interconnects, an overlay of 2500 Angstroms of Au is employed with a thin interspaced layer of Pt or Ti for improved adhesion.

While these contacts have good ohmic properties for device and integrated circuit application, there is room for improvement. For example, Au as a high atomic mass element (197) will tend to absorb relatively more X-ray energy than would a lighter element, leading to deterioration of conductivity. This can have significant consequences in a high energy radiation environment.

SUMMARY OF THE INVENTION

The ohmic contacts of this invention have been fabricated to n-type Gallium Arsenide with an alloy of Aluminum Germanium which has a eutectic temperature of 424° C. with 53 weight percent Germanium. The lowest contact resistance of $1.4 \times 10^{-6}$ ohm-cm² for the contact was measured with a transfer length transmission line structure. In the specific embodiment, the substrate material was LEC grown semi-insulating Gallium Arsenide without intentional doping, with upper Si+ ion implanted n-type layers. A typical peak impurity concentration is in the range of $10^{17}$ to $10^{18}$ cm$^{-3}$. Rapid thermal anneal at 825° C. was used to activate the ion implantations. The contact itself was prepared by a series of evaporations in the sequence of 400 Angstroms of Germanium, 300 Angstroms of Nickel and 2000 Angstroms of Aluminum. A contact resistance of $1.4 \times 10^{-6}$ ohm-cm² was obtained at 500° C. After alloying, another layer of Aluminum approximately 2500 Angstroms thick was deposited on top of the alloyed contact and serves as the first level interconnection.

DESCRIPTION OF THE DRAWINGS

FIG. 1 is a cross-sectional diagrammatic view of the ensemble of metallization on top of the Gallium Arsenide layers prior to the alloying step; and FIG. 2 is a graph showing the dependence of the specific contact resistance upon the n-doping concentration in the substrate, here silicon ions.

DETAILED DESCRIPTION OF THE INVENTION

Although the invention will be described hereinafter in the context of a preferred embodiment, the true scope of the invention will be found in the appended claims The invention was implemented in a matrix of 50 JFET's with devices of 1 micron channel length and 15 micron channel width. The matrix was fabricated by a lift-off process utilizing the Aluminum Germanium contacts of this invention. The Gallium Arsenide JFET's were fabricated by a known process. See G. Troeger and J. Notthoff, "A Radiation-Hard Low-Power GaAs Static Ram Using E-JFET Spaced DCFL." GaAs IC Symp. Technical Digest, page 78, 1983. Only a first level metal interconnect was used, the devices were measured by point contact probes to source entering the contacts in the array, and only the gates were connected with one micron lines to a common large area pad. The threshold voltage of a typical enhancement mode JFET in the array was +0.3 volts, and the transconductance was 120 ms/mm. The average values of transistor values in the matrix and their standard deviations were:

$V_T = (+0.36 \pm 0.04)$ volts $I_{DS} = (503 \pm 76)$ micro amps (at $V_G = +1$ v)

$g_m = (106 \pm 8)$ mS/mm (at $V_G = +1$ v)

The contacts were prepared by conventional evaporation techniques in the sequence of 400 Angstroms of Germanium, 300 Angstroms Nickel and 200 Angstroms of Aluminum For the substrate material, LEC grown semi-insulating Gallium Arsenide without intentional doping was used with Si+ ion implanted n-type layers. A typical peak impurity concentration is in the range of $10^{17}$ to $10^{18}$ cm$^{-3}$. This sequence is shown in FIG. 1 in which region 10 is the semi-insulated substrate, the region 12 is the ion implanted n-type layer, layer 16 is the Germanium layer, layer 18 is the Nickel layer, and layer 20 is the Aluminum layer. The region 14 bounded by the dotted line enclosing the notation "n+" indicates the region of the layer 12 into which the Germanium will migrate after alloying to form an especially high concentration of n impurities. The interface between the Germanium layer 16 and the n-type layer of Gallium Arsenide 12 is marked as 15. Rapid thermal annealing at 825° C. was used to activate the ion implantations. By increasing alloying temperature, a contact resistance of $1.4 \times 10^{-6}$ ohm-cm² was obtained at 500° C. The Nickel layer 18 is required to prevent balling up of the Al-Ge after alloying and leads to smooth surface texture of the contact layer. The alloying step is carried out in the reducing atmosphere of hydrogen in a graphite strip heater. The time of alloying ranges from 1 to 30 minutes. After the alloying procedure, an overlay of 2500 Angstroms of pure Aluminum was evaporated and patterned utilizing a conventional photoresist liftoff method. This layer of Al is not shown in FIG. 1.

While the bulk resistivity of Aluminum is $2.7 \times 10^{-6}$ ohm-cm, and is slightly higher than the value of $2.2 \times 10^{-6}$ ohm-cm for Gold, the sheet resistivity of 2500 Angstroms of Aluminum is 120 milli-ohms/² and less than that for 2500 Angstroms of magnatron sputtered Gold which has a sheet resistivity of 160 milli-ohms per square. At the second interconnect level, 5000

Angstroms of Gold has a sheet resistivity of 80 milli-ohms per square (sputtered) while the Aluminum is again less with 60 milli-ohms per square (evaporated). For a thickness of one micron (10000 Angstroms) the sheet resistivity of an Aluminum layer of this thickness drops to 30 milli-ohms per squire. Thus it would be advantageous to use a thicker layer of Aluminum for the second metal interconnect layer than is presently used for Gold and similar applications which is typically 5000 to 6000 Angstroms.

The Al-Ge alloy could also be deposited by other techniques besides the conventional sequential deposition by evaporation of the respective Ge, Ni and Al layers followed by alloying For example, an already alloyed mixture of Al-Ge in the form of pellitized material could be deposited onto the GaAs by flash evaporation Also, co-evaporation of Al and Ge could be conducted to deposit the correct eutectic alloy mixture on the GaAs. The phase diagram for the Al-Ge system can be found in Hansen's book, *Constitution of Binary Alloys,* referenced above.

FIG. 2 is a graph which demonstrates the dependence of the specific contact resistance, $R_C$, in ohms-cm$^2$ as a function of the level of n-type ions in substrate (cm$^{-3}$). The graph clearly demonstrates the benefits of high levels of n-type impurities in the diffused contact region as shown by the region 14 in FIG. 1.

It was also found that contact resistance decreased as the alloying temperature increased for a peak n-type impurity concentration of about $10^{18}$ cm$^{-3}$.

I claim:

1. A ohmic contact metallization for use on semiconductor compounds comprising Gallium Arsenide (GaAs), the metallization comprising:
   an alloyed ensemble of Germanium and Aluminum with sufficient Nickel to provide effective wetting and attachment for the Al and Ge to the GaAs upon alloying.

2. The metallization of claim 1 further including an additional first metal interconnect layer of at least 2000 Angstroms of Al atop the alloyed ensemble.

3. The metallization of claim 1 wherein the ensemble consists essentially of about 400 Angstroms of Ge, then about 300 Angstroms of Ni and then about 2000 Angstroms of Al, with the Ge being the layer adjacent the GaAs.

4. The metallization of claim 1 wherein the alloying is conducted at about 500° C. for a period of from 1 to 30 minutes in a reducing gas atmosphere.

5. The metallization of claim 1 wherein the region of the GaAs underlying the alloyed ensemble has a peak impurity concentration of n-type impurity ions of at least about $10^{17}$ cm$^{-3}$ prior to alloying.

* * * * *